United States Patent [19]

Isamu et al.

[11] 3,907,425

[45] Sept. 23, 1975

[54] AUTOMATIC REGISTER MARK PRINTING CONTROL DEVICE IN AN ENGRAVING MACHINE

[76] Inventors: Itoi Isamu, Matsunoshita-cho 16, Tzumoji, Kita-ku, Kyoto; Sugou Kiyoshi, Nagatsuda-cho 2251, Midori-ku, Yokohama, Kanagawa, both of Japan

[22] Filed: June 11, 1974

[21] Appl. No.: 478,239

[52] U.S. Cl. .......................... 355/40; 355/53; 355/54

[51] Int. Cl.[2] .......................G03B 27/52; G03B 27/42; G03B 27/44

[58] Field of Search .................... 355/40, 41, 53, 54; 250/215, 219; 346/107 P

[56] References Cited

UNITED STATES PATENTS

| | | | |
|---|---|---|---|
| 3,494,695 | 2/1970 | Sollima et al. | 355/41 |
| 3,563,648 | 2/1971 | Baggaley et al. | 355/53 X |
| 3,566,763 | 3/1971 | Knopf | 355/53 X |
| 3,588,820 | 6/1971 | Cobb et al. | 355/41 X |
| 3,704,946 | 12/1972 | Brault et al. | 355/53 X |

*Primary Examiner*—Richard A. Wintercorn
*Attorney, Agent, or Firm*—Marvin H. Kleinberg

[57] ABSTRACT

A register mark printing device in an engraving machine including plural register mark printing means whereby light application to the register mark sections provided around a light-penetrating original image in the negative holder is selectively controlled to produce either irradiated or non-irradiated condition, and in performing engraving operation, said printing means are moved pitch by pitch in both X-axis and Yaxis directions, and at each position for engraving, a designated register mark printing means alone is automatically operated to effect printing of the particular register mark.

4 Claims, 8 Drawing Figures

AUTOMATIC REGISTER MARK PRINTING CONTROL DEVICE IN AN ENGRAVING MACHINE

This invention relates to a register mark printed device in an engraving machine in used in photoengraving process, and more particularly to means for printing each register mark correctly at a prescribed position on an engraved and printed form plate by automatically controlling the register mark printing units accordingly to the engraving layout.

Generally, in printing a plurality of negatives on a printing plate or film in an engraving machine, register marks for positioning (registering) are usually provided around the image portion of each negative. Therefore, when practicing engraving by placing the respective printed image segments adjacent to each other, it is often experienced that some register marks enter the adjoining image segments. In order to avoid this, it is generally practiced to provide several rotatable shades or light-intercepting plates at pertinent parts of the negative holder frame and operate said shades through remote control so as to print the register marks only at the required portions.

However, according to this means, since the operation of the shades is controlled manually by the operator, it depends on judgement of the operator to decide which of the register marks is to be printed or shaded from light. This naturally requires much time and labor and also involves high possibility of inviting misoperation.

When adapting said register mark printing device in an engraving machine of an automatic control system which is being popularized lately, it is highly desirable that the printing device is also cont rolled automatically. In this case, it is not difficult to add a control unit for controlling operation of the register mark printing device to the existing automatic control system which controls operations for plate feeding to printing position, positioning (registering), close attaching of the negative to sensitive material, printing and exposure, but such addition complicated the control program and also invites reduction of working efficiency. It is also impossible to adapt such system in a manual engraving machine.

In view of the above, the present invention is intended to provide a means for automatically controlling operation of any desired one of the register mark printing units correctly and with a relatively simple mechanism.

The invention is now described in detail with reference to the accompanying drawings, in which.

Figure 1:
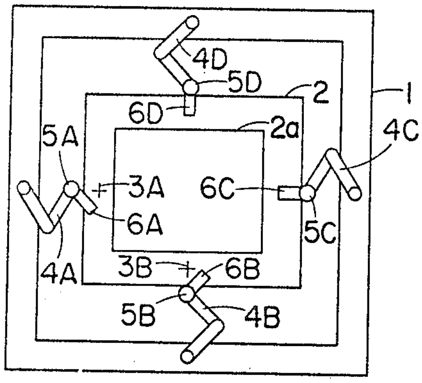
FIG. 1 is a schematic view of the negative holder assembly in an engraving machine equipped with register mark printing units.

Referring to FIG. 1, it will be seen that a light-penetrable negative 2 is disposed in the center of a negative holder 1, and around an image 2*a* in said negative 2 are provided light-penetrable register marks 3A, 3B, 3C and 3D, although 3C and 3D are not shown in the drawings as they are concealed by light intercepting means.

Four sets of register mark printing units are provided centrally in the respective sides of the negative holder 1. Each of said register mark printing units comprises an articulated arm 4A, 4B, 4C, 4D, a rotary solenoid 5A, 5B, 5C, 5D, secured at an end of said articulated arm, and a light-intercepting plate 6A, 6B, 6C, 6D mounted to the actuator of said solenoid. Each said articulated arm is suitably adjusted so as to fix the associated light-intercepting plate at the position where it conceals the register mark, and when the rotary solenoid is connected to power and energized, the associated actuator is turned to move the light-intercepting plate to expose the register mark to the printing light source.

Figure 2:
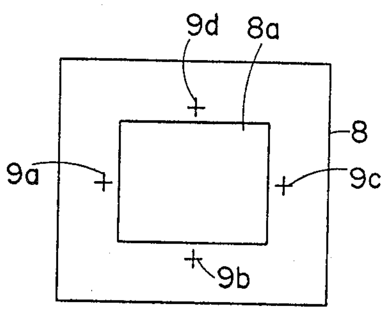
FIG. 2 is a drawing showing an exposed and printed image segment.

The negative holder 1 having said arrangement is closely attached to a sensitive material and then exposed to a suitable light source for effecting printing, Here, if said register mark printing units are not provided, the images 9*a*,9*b*, 9*c*, 9*d* of the respective marks are printed along with the negative image 8*a* on the sensitive material 8 as shown in FIG. 2.

However, in the photo-engraving process, printing is practiced by repetitively moving a same image in the lateral direction (hereinafter referred to as X-axis direction) as well as in the vertical direction (hereinafter referred to as Y-axis direction), so that when the image interval is small or when the images are closely attached to each other, the register marks of the adjoining images could be positioned within the image surfaces. Therefore, said register mark printing units are provided to print only those register marks which are located at the required spots.

Figure 3:
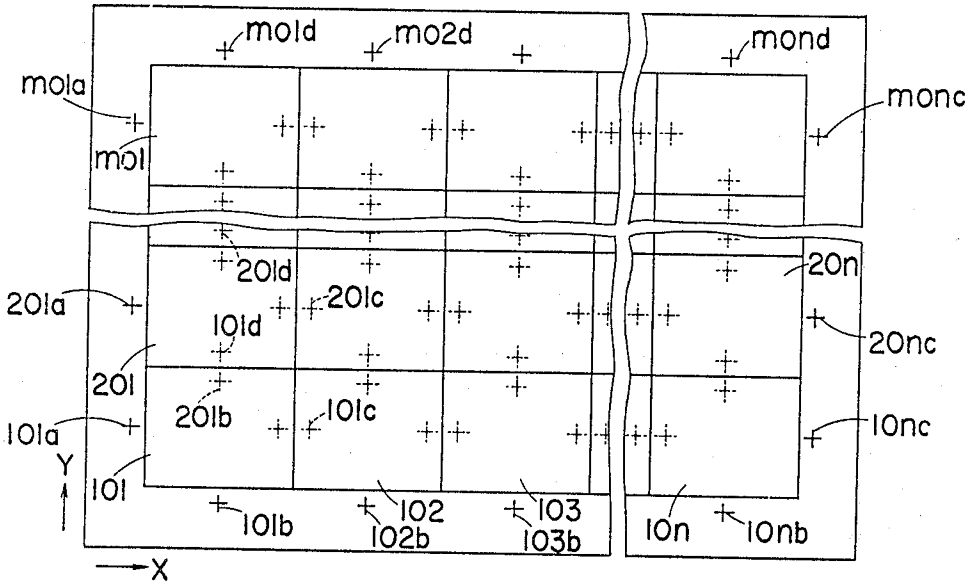
FIG. 3 is a chart showing relation between engraving layout and register marks.

FIG. 3 shows the relation between the engraving layout and the register marks to be printed. As apparent from the figure, in the case of the image 101 at the extreme left bottom end, two register marks 101*a* and 101*b* are exposed and printed, while the remaining two register marks 101*c* and 101*d* must be shaded from light. Therefore, at this position, it is required to energize the rotary solenoids 5A and 5B alone.

Then, when printing the image 102 by further moving the negative holder one pitch in the X-axis direction, the register mark 102*b* alone is exposed while other three register marks must be shaded. The same holds true with the next image 103, but in the case of the image 10*n* positioned at the extreme right bottom end in the layout comprising *n* pieces of images arranged in the X-axis direction, two register marks 10*nb* and 10*nc* are exposed while other two register marks 10*na* and 10*nd* are shielded from light.

Thus, the negative holder is further moved one pitch in the Y-axis direction to perform printing of a line of image positioned at the second stage from the bottom. In this case, for printing the image 201 at the extreme left end, the register mark 201*a* alone is exposed, with other three marks being left non-exposed. In this line of images, all of the register marks in the respective images must be shielded from light, with only exception of the image 20*n* at the extreme right end where the register mark 20*nc* is exposed to light.

Figure 4:
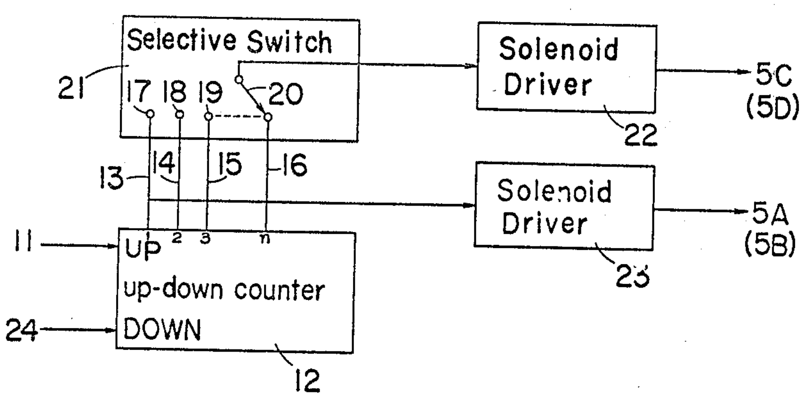
FIG. 4 is an electric block diagram showing a first embodiment of the automatic control circuit according to the present invention.

Referring to FIG. 4, there is shown an embodiment of the means for automatic control of said negative printing positions and register mark printing. In the shown embodiment, such automatic control units are provided one each in the X-axis direction and in the Y-axis direction, but the unit in the X-axis direction alone is shown in the figure.

A signal 11 is issued upon every positioning operation from a mechanism for driving and positioning the negative holder assembly of the engraving machine, and such signal is applied to the "UP" side end of an up-down counter 12. Said up-down counter 12 issues an output signal from its output terminal upon receiving every input signal 11, and said output signal is progressively transferred from said output terminals 13, 14, 15, until such output signal is finally obtained at the output terminal 16 and "*n*" times of occurence of input signal. For instance, in an electromagnetic counter provided with a rotary switch, such output signal is created in an output line corresponding to the counted value.

The output terminals of said up-down counter 12 are connected to the corresponding input terminals of a selective switch assembly 21 having a wiper 20 by which the input terminals 17, 18, 19, . . . are selectively connected or disconnected. The output from the wiper 20 of the selective switch 21 connected to the first-stage output 13 and *n*th-stage output 16 of the up-down counter 12 is transmitted through the respective solenoid drivers 22 and 23 to the rotary solenoids 5A and 5C, respectively, of the register mark printing device.

This printing device operates as follows. Firstly, the number of segments to be engraved *n* is obtained according to the engraving layout and the wiper 20 is connected to the *n*th-stage input terminal 16 of the selective switch 21 on the X-axis side. Likewise, the number of the segments to be engraved *m* in the Y-axis direction is obtained and the wiper 20 of the selective switch 21Y on the Y-axis side is connected to the *m*th-stage terminal. Then the negative (position of the image 101 in FIG. 3) and fixed thereat. Here, if setting is made such that an output comes out from the first-stage output terminal 13 of the up-down counter 12, said output is transmitted through the solenoid driver 23 to the rotary solenoid 5A to energize it, whereby the light-intercepting plate 8A is moved away from the register mark section to expose and print the register mark 101*a*.

Similarly, In the Y-axis direction, the rotary solenoid 5B is energized by the output from the first-stage terminal 13Y of the up-down counter 12Y and the light-intercepting plate 6B moves away from the register mark section to expose and print the register mark 101*b*. In this case, since the rotary solenoids 5C and 5D remain non-energized, the light-intercepting plates 6C and 6D stay in their light-intercepting positions, and hence the remaining two register marks 101*c* and 101*d* are not exposed.

Then, when the negative holder is further moved one pitch in the X-axis direction and located at the position of the image 102 in FIG. 3, signal 11 is applied once to the "UP" side end on the up-down counter 12 on the X-axis side, and the output from the terminal 13 vanishes and instead it appears at the terminal 14. Consequently, electric current to the rotary solenoid 5A is shut off and the light-intercepting plate 6A returns to its light-intercepting position. On the other hand, since the negative holder is not yet moved in the Y-axis direction, the respective parts in this direction are maintained in the same condition as during the printing of FIG. 1. Therefore, when the image 102 undergoes exposure, the register mark 102*b* alone is exposed simultaneously and other three register marks 102*a*, 102*c* and 102*d* stay shaded from light.

When the *n*th engraving operation in the X-axis direction is performed, output appears at the *n*th-stage terminal 16 of the up-down counter 12 on the X-axis side, and such output is transmitted through the solenoid driver 22 to the rotary solenoid 5C to energize it, whereby the light-intercepting plate 6C is displaced from the register mark section and the register mark 10*nc* on the right side edge of the entire layout is exposed to light.

Upon completion of exposure and printing of the line of images on the first stage in the X-axis direction, the negative holder is returned to its original position. In this case, if arrangement is made such that a signal 24 will be issued for one pitch advancement of the engraving layout with returning movement and that such output will be applied to "DOWN" side end of the up-down counter 12 to return the counter, the respective register mark printing means 5A, 5B, 5C and 5D will restore the same condition as at the start of the operation when the negative holder returns to the position of the image 101.

Figure 5:
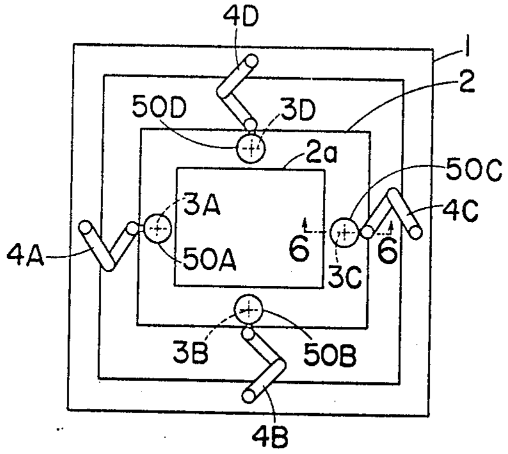
FIG. 5 is a view similar to FIG. 1, showing another embodiment of the register mark printing device.

Thus, when the negative holder is moved one pitch in the Y-axis direction, the register mark 201*a* alone is exposed, with the other three register marks 201*b*, 201*c* and 201*d* being concealed, in the same way as in the case of the X-axis direction. And when said holder is further moved one pitch in the X-axis direction, all of the four register marks are shaded from light, Referring to the FIG. 5, there is shown a modified form of the register mark printing device according to the present invention. In the embodiment, light radiating means 50A, 50B, 50C and 50D are provided at the ends of the respective universal arms adapted to support the articulated arms 4A, 4B, 4C and 4D, respectively, at one end thereof to the base portion of the negative holder 1. Said radiating means are positioned for engraving the respective register marks 3A, 3B, 3C and 3D by adjusting the associated universal arms.

Figure 6:
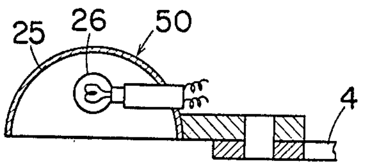
FIG. 6 is a longitudinal sectional view taken along the line 6—6 of FIG. 5.

Each of said light radiating means comprises a lamp 26 covered by a bowl-shaped non-transparent shade 25 having an opening opposed to the register mark, as shown in FIG. 6. Shade 25 is adapted to intercept light rays from the light source, while lamp 26 is lighted at suitable times to print the register mark thereblow. The light radiating means 50A – 50D are controlled substantially in the same way as said solenoids 5A – 5D in the preceding embodiment, but in this case, said radiating means must be controlled into a state where they can radiate light.

In practice, said radiating means are actuated to radiate light at good timing by using other control signal. For instance, said means may be "anded" with the signal 27 for performing exposure and printing of the negative 2 as in the ensuring embodiment shown in FIG. 8.

Figure 7:
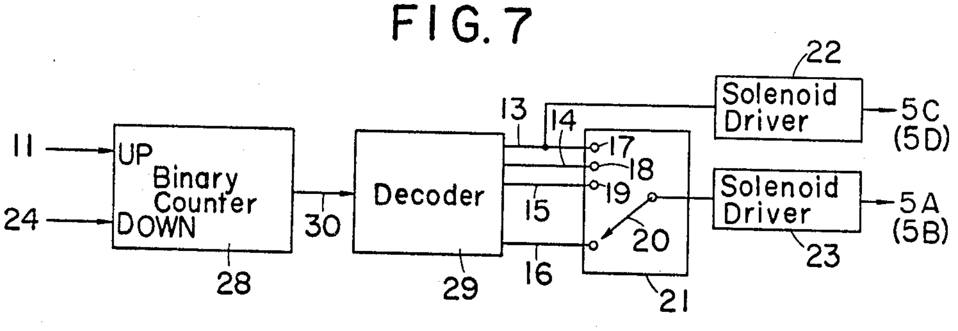
FIG. 7 is an electric block diagram showing a second embodiment of the automatic control circuit according to the present invention.

FIG. 7 shows a second embodiment of the automatic control circuit. In this embodiment, an up-down type binary counter 28 and a decoder 29 of any desired digit number system constitute in combination a means corresponding to the up-down counter 12 of the embodiment of FIG. 4. The output generating system of the decoder 29 is same as that shown in FIG. 4.

The decoder 29 is set at $n$-digit or $m$-digit sclae according to the maximum value $n$ or $m$ of the expected number of segments to be engraved in both X-axis and Y-axis directions. It receives binary code 30 from the binary counter 28 and issues $n$ or $m$ pieces of output lines in the order of counting according to the values counted by the binary counter 28. the inter-relation of the output lines in said decoder 29 is same as the embodiment of FIG. 4 and hence is expressed by using the same referrence numerals. The selective switch 21 and drivers 22, 23 may be completely same as those in FIG. 4.

Figure 8:
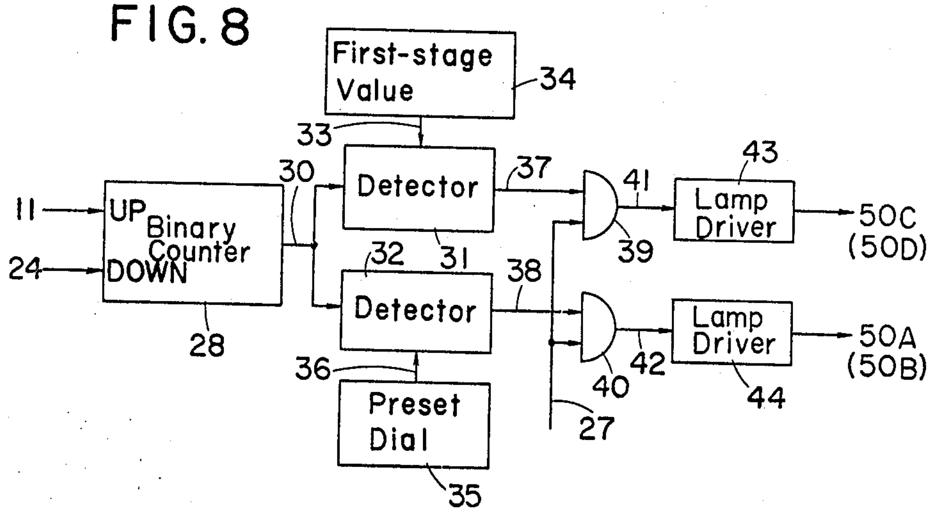
FIG. 8 is also an electric block diagram showing a third embodiment of the automatic control circuit according to the present invention.

FIG. 8 shows a third embodiment different from those of FIGS. 4 and 7. In this embodiment, the binary counter 28 is identical with that of FIG. 7 and issues a binary code 30, and this binary code is fed into two coincidence detectors 31 and 32. One of said concidence detectors 31 is connected to an encoder 34 which fixes and encodes the binary code 33 of the first stage value counted by the counter 28 and constitutes a preset counter preset at a fixed value. The other concidence detector 32 is connected to a preset dial 35 to constitute a preset counter in which the set value is varied. The preset dial 35 is a numerical value setting device comprising a digital switch, etc., whereby the set value is coded into a binary 36. The set value of the preset dial 35 is the numerical value set in said selective switch 21. That is to say, the expected number of segments to be engraved in both X-axis and Y-axis directions.

Thus, since the coincidence signal 37 from the coincidence detector 31 is the one that is issued when the counter 28 has counted the first-stage value, it is same as that of the output line 13 in FIG. 4 and FIG. 7. Also, since the coicidence signal 38 from the coincidence detector 32 is the one that is issued when the counted value of the counter 28 becomes equal to the value set in the preset dial 35, it is same as that obtained in wiper 20 in FIGS. 4 and 7. Further, coincidence signals 37 and 38 from said coincidence detectors 31 and 32 are impressed to the AND circuits 39 and 40, respectively, and "anded" with the control signal 27 of the light source for exposure and printing outputs 41 and 42 from the AND circuits 39 and 40 are impressed to the lamp drivers 43 and 44, respectively, to control the light radiating means 50C and 50A shown in FIG. 5.

In the embodiment of FIG. 7, coincidence signals 37 and 38 from the coincidence detectors 31 and 32 may be impressed to the solenoid drivers 22 and 23 to energize the solenoids 5C and 5A, respectively.

Thus, according to the device of the present invention, required register marks can be printed only at the peripheral portion of the entire superposed on the image section may be erased off.

While the present invention has been described by way of its embodiments where the invention is embodied as a register mark printing device for registering, it is of course possible to use the present device for printing of other marks which are essentially same as the register marks, such as for example "cutting-off marks" indicating the cutter position when cutting the engraved printed materials individually.

We claim:

1. An automatic register mark printing control device in an engraving machine, comprising:

register mark printing means comprising rotary solenoids provided at the ends of universal arms supported at one end to the base portion of a negative holder, and light-intercepting plates provided at the edge of actuators of said solenoids so as to cover the respective register marks with said light-intercepting plates whereby light applied to the register mark sections provided around a light-penetrating original image in a negative holder is selectively controlled to produce either irradiated or non-irradiated condition, said register mark printing means generating a signal upon completion of every positioning operation;

counter means responsive to the signal generated by said plural register mark printing means for counting the number of engraving operations completed in each of the X-axis and Y-axis directions during the engraving process;

numerical value setting means for previously setting the numerical value of the number of segments to be engraved in both X-axis and Y-axis directions according to the engraving layout;

comparison means responsive to said counter means and to said numerical value setting means for comparing the counted value of said number of engraving operations and the set value of the number of segments to be engraved; and, selection control means responsive to said comparison means for selectively controlling said plural register mark printing means according to the result of comparison of said counted value and set value.

2. An automatic register mark printing control device in an engraving machine, comprising:

register mark printing means comprising light radiating means with associated light interceptive shades which are provided at the ends of universal arms supported at one end to the base portion of a negative holder, whereby the respective register marks are covered with said shades and light is radiated at suitable times from said light-radiating positions to irradiate the register marks, said register mark printing means generating a signal upon completion of every positioning operation;

counter means responsive to the signal generated by said plural register mark printing means for counting the number of engraving operations completed in each of the X-axis and Y-axis directions during the engraving process;

numerical value setting means for previously setting the numerical value of the number of segments to be engraved in both X-axis and Y-axis directions according to the engraving layout;

comparison means responsive to said counter means and to said numerical value setting means for comparing the counted value of said number of engraving operations and the set value of the number of segments to be engraved; and, a selection control means responsive to said comparison means for selectively controlling said plural register mark printing means according to the result of comparison of said counted value and set value.

3. An automatic register mark printing control device in an engraving machine, comprising:

register mark printing means whereby light applied to the register mark sections provided around a light-penetrating original image in a negative holder is selectively controlled by positioning said register mark printing means to produce either irradiated or non-irradiated condition, said register mark printing means generating a signal upon completion of every positioning operation;

counter means responsive to the signal generated by said plural register mark printing means for counting the number of engraving operations in each of the X-axis and Y-axis directions during the engraving process;

numerical value setting means for previously setting the numerical value of the number of segments to be engraved in both X-axis and Y-axis directions according to the engraving layout;

comparison means responsive to said counter means when it exceeds its capacity and responsive to the set value of the number of segments to be engraved for generating a comparison means output; and, selective control means for selectively controlling said plural register mark printing means in response to the comparison means output.

4. An automatic register mark printing control device in an engraving machine, comprising:

register mark printing means whereby light applied to the register mark sections provided around a light-penetrating original image in a negative holder is selectively controlled by positioning said register mark printing means to produce either irradiated or non-irradiated, said register mark printing means generating a signal upon completion of every positioning operation;

counter means responsive to the signal generated by said plural register mark printing means for counting the number of engraving operations in each of the X-axis and Y-axis directions during the engraving process;

first numerical value setting means for previously setting the numerical values of the number of segments to be engraved in both X-axis and Y-axis directions according to the engraving layout;

second numerical value setting means for previously setting the numerical value of the first stage of said counter means in both X-axis and Y-axis directions;

first comparison means for comparing the number of engraving operations completed as counted by said counter and the set value of the number of segments to be engraved, as set on said first numerical value setting means;

second comparison means for comparing the number of engraving operations completed as counted by said counter and the set value of the first stage of said counter as set on said second numerical value setting means; and selection control means further comprising a first AND gate in which the output of said first comparison means is AND-ed with a negative printing and exposing control signal to effect selective control of said register mark printing means and a second AND gate in which the output of said second comparison means is AND-ed with the negative printing and exposing control signal to effect selective control of said register mark printing means.

* * * * *

UNITED STATES PATENT OFFICE

CERTIFICATE OF CORRECTION

Patent No. 3,907,425 Dated September 23, 1975

Inventor(s) Isamu Itoi and Kiyoshi Sugou

It is certified that error appears in the above-identified patent and that said Letters Patent are hereby corrected as shown below:

On the first page of the patent please note that the Inventors names should be -- Isamu Itoi -- and -- Kiyoshi Sugou -- instead of "Itoi Isamu" and "Sugou Kiyoshi" as they now appear.

Signed and Sealed this

*thirtieth* Day of *March 1976*

[SEAL]

*Attest:*

RUTH C. MASON
*Attesting Officer*

C. MARSHALL DANN
*Commissioner of Patents and Trademarks*